(12) United States Patent
Suzuki

(10) Patent No.: US 7,702,705 B2
(45) Date of Patent: Apr. 20, 2010

(54) RANDOM NUMBER GENERATION CIRCUIT

(75) Inventor: Taketoshi Suzuki, Kawasaki (JP)

(73) Assignee: Kabushiki Kaisha Toshiba (JP)

( * ) Notice: Subject to any disclaimer, the term of this patent is extended or adjusted under 35 U.S.C. 154(b) by 1072 days.

(21) Appl. No.: 11/376,659

(22) Filed: Mar. 14, 2006

(65) Prior Publication Data

US 2006/0244544 A1 Nov. 2, 2006

(30) Foreign Application Priority Data

Mar. 15, 2005 (JP) ............................. 2005-073444
Mar. 13, 2006 (JP) ............................. 2006-067462

(51) Int. Cl.
*G06F 7/58* (2006.01)

(52) U.S. Cl. ..................................... 708/250

(58) Field of Classification Search ........................ None
See application file for complete search history.

(56) References Cited

U.S. PATENT DOCUMENTS 5,796,776 A * 8/1998 Lomp et al. .................. 375/222
6,480,072 B1 11/2002 Walsh et al.
7,139,397 B2 * 11/2006 Messina et al. ................ 380/46
2004/0205095 A1 * 10/2004 Gressel et al. .............. 708/253

FOREIGN PATENT DOCUMENTS

JP P2002-236582 8/2002

* cited by examiner

*Primary Examiner*—David H Malzahn
(74) *Attorney, Agent, or Firm*—DLA Piper LLP (US)

(57) ABSTRACT

A random number generation circuit has a ring oscillator which has odd number of inverting amplifiers connected in ring shape, a delay control circuit which generates a predetermined clock signal by delaying a reference clock signal, a first sampling circuit which samples an oscillation signal generated by the ring oscillator with the predetermined clock signal, a first logical equalization circuit which equalizes occurrence frequency of "0" and "1" of a sampling signal sampled by the first sampling circuit, a linear feedback shift register (LFSR) which generates random serial data based on an output signal of the first logical equalization circuit, and a serial-parallel converter which generates random parallel data used for controlling a delay amount of the delay control circuit by converting the random serial data from serial to parallel.

20 Claims, 8 Drawing Sheets

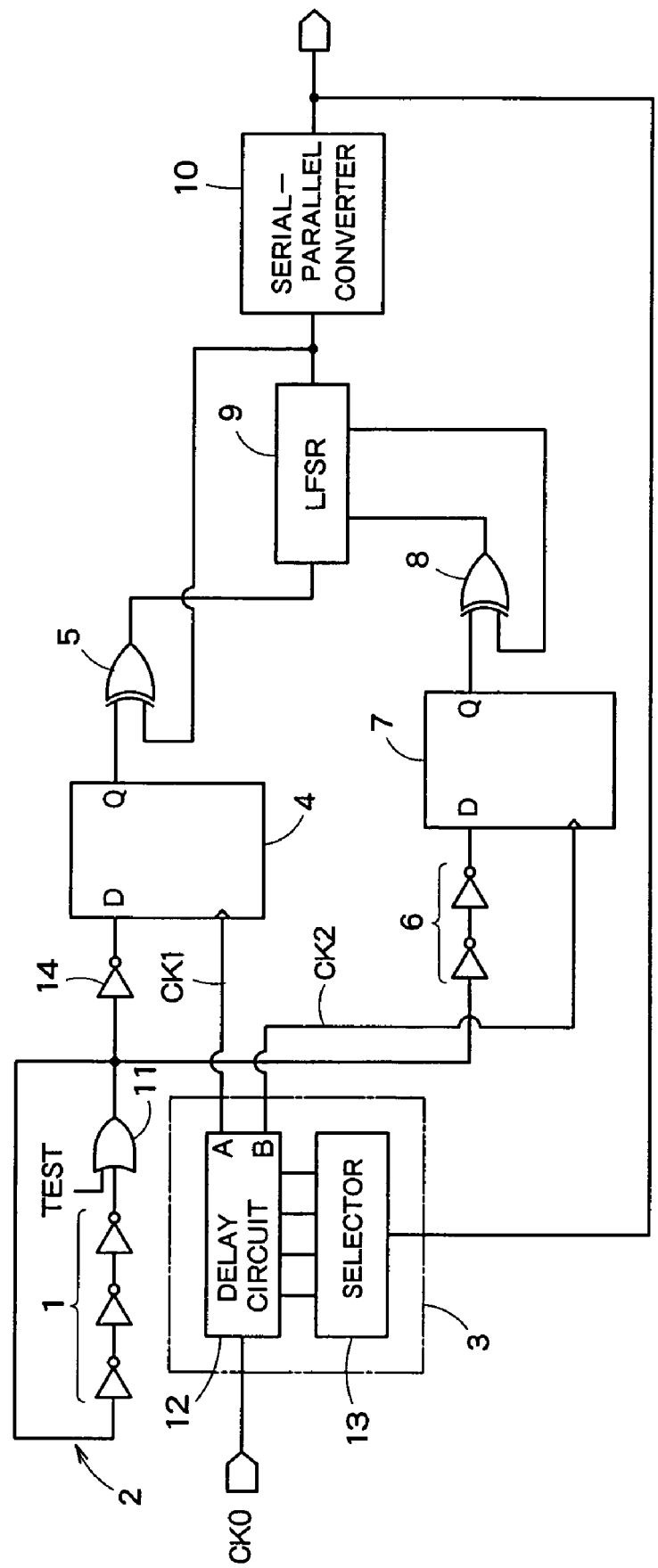
F I G. 1

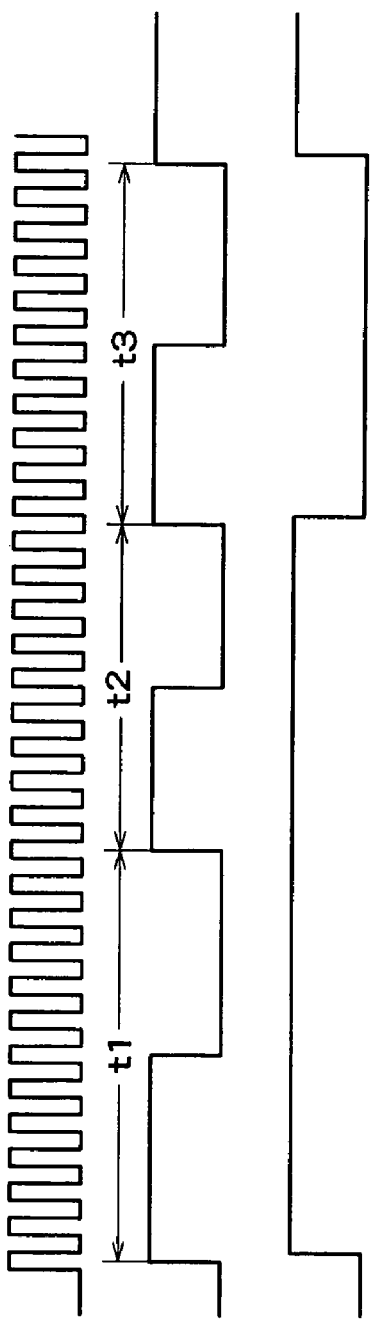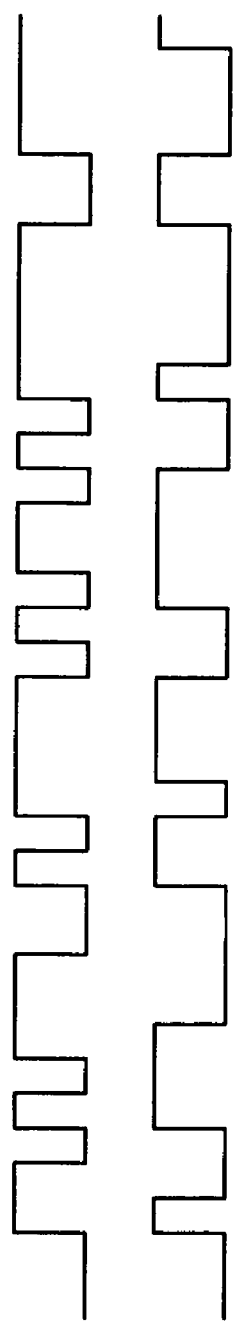

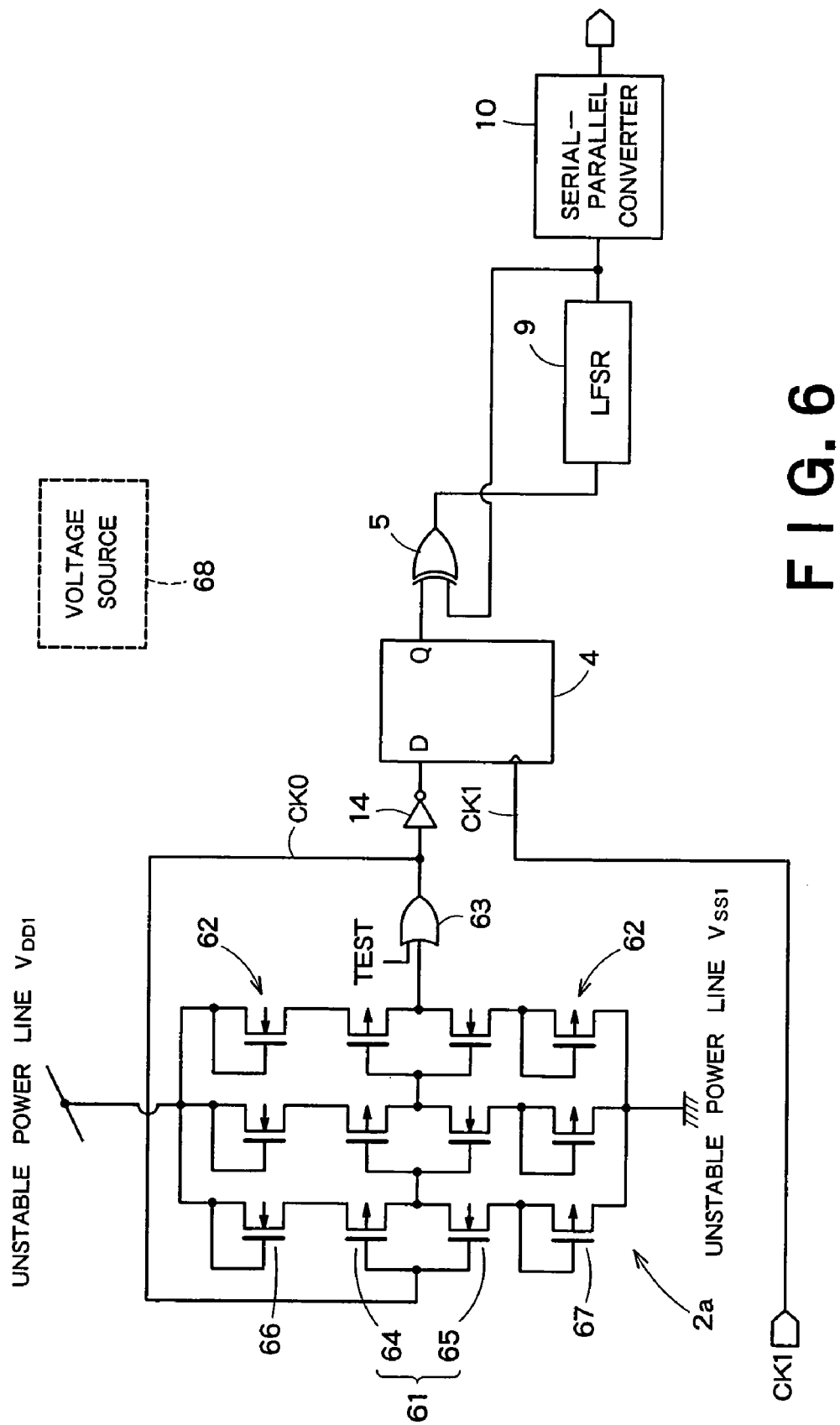
F I G. 6

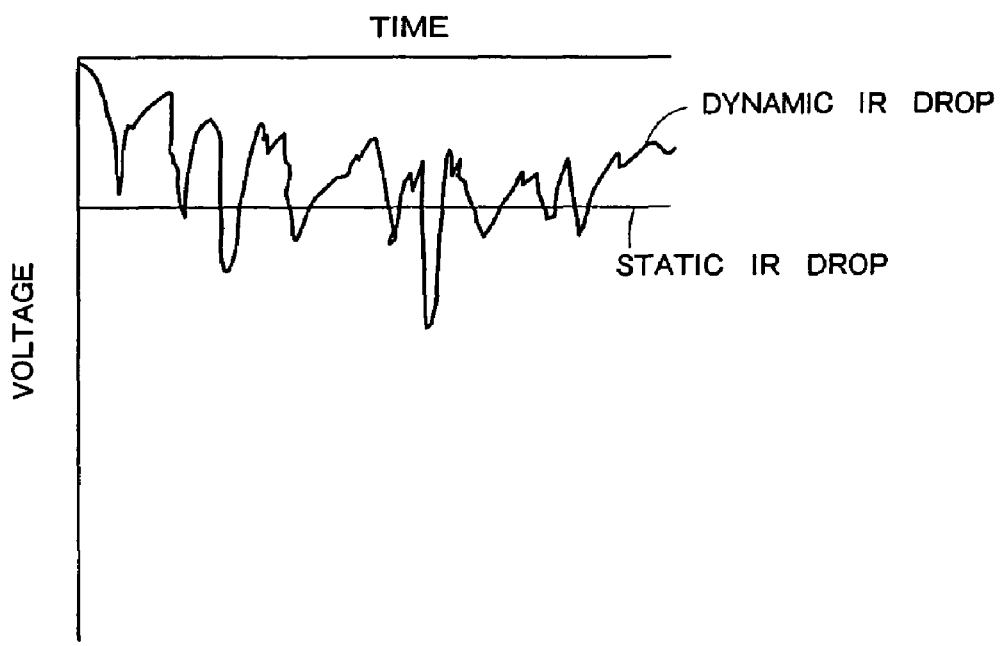
F I G. 8
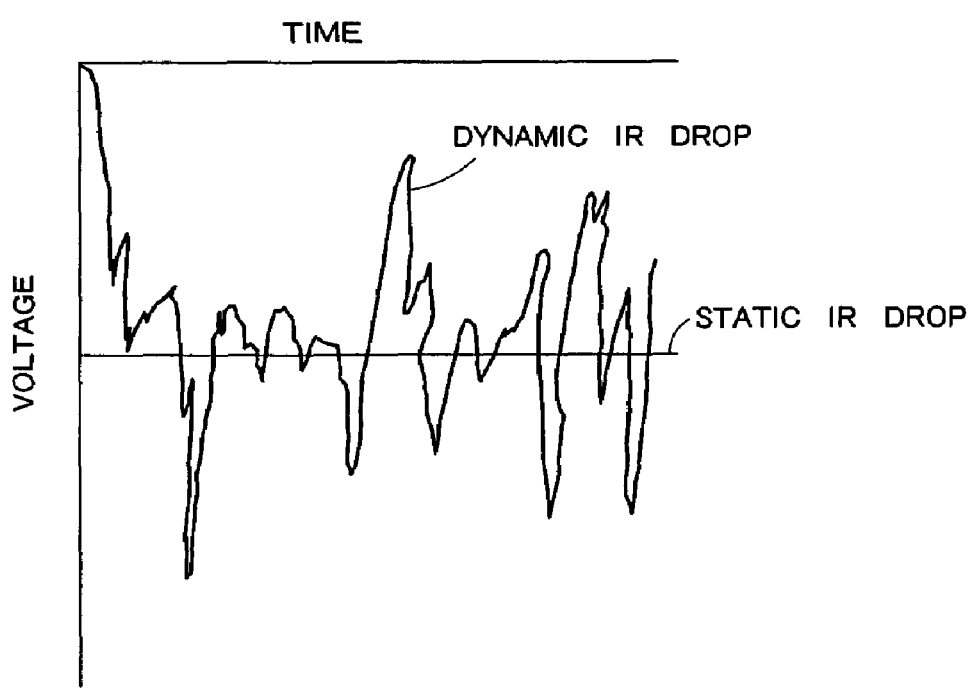
F I G. 9

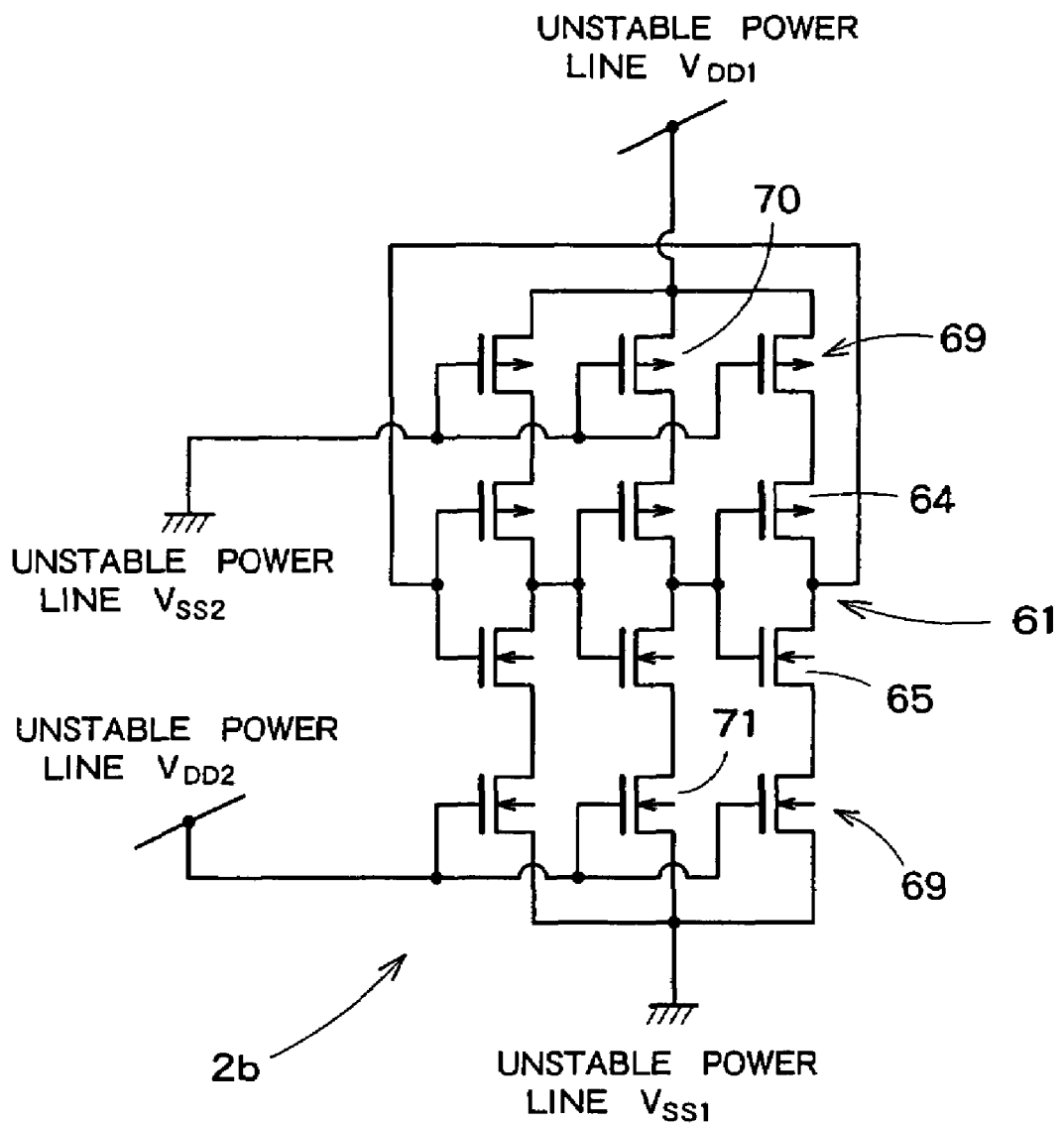
F I G. 10

RANDOM NUMBER GENERATION CIRCUIT

CROSS REFERENCE TO RELATED APPLICATIONS

This application is based upon and claims the benefit of priority from the prior Japanese Patent Applications No. 2005-73444, filed on Mar. 15, 2005 and No. 2006-67462, filed on Mar. 13, 2006, the entire contents of which are incorporated herein by reference.

BACKGROUND OF THE INVENTION

1. Field of the Invention

The present invention relates to a random number generation circuit which generates random numbers.

2. Related Art

A random number generation circuit provided with an oscillation circuit connected to one or three CMOS inverters, a flip-flop which latches an oscillation signal generated by this oscillation circuit and a feedback shift register which generates pseudo-random numbers based on an output signal of the flip-flop is known (see Japanese Patent Laid-Open No. 2002-236582).

This type of conventional random number generation circuit inputs the output signal of the flip-flop as a seed to the feedback shift register. It is possible to improve randomness of random numbers using a feedback shift register or the like at subsequent stage to a certain degree. However, it is not possible to reduce the probability of collision of finally obtained random numbers unless the seed to be input to the feedback shift register has a sufficient level of randomness.

The probability of collision of random numbers depends on the uncertainty of the seed generated by the flip-flop and this uncertainty mainly depends on the fact that the oscillation circuit composed of the CMOS inverters is unstable with respect to fluctuation of temperature and supply voltage. With this uncertainty alone, according to the conventional method, there is a high probability that the same seed may be generated within a random numbers generating period, as long as there are not considerable disturbance factors in the temperature and supply voltage or the like. Therefore, it is difficult for the conventional method to reduce the probability of collision of random numbers. In this way, the conventional random number generation circuit has a problem that it is not possible to obtain high quality random numbers.

SUMMARY OF THE INVENTION

According to one embodiment of the present invention, a random number generation circuit, comprising:

a ring oscillator which has odd number of inverting amplifiers connected in ring shape;

a delay control circuit which generates a predetermined clock signal by delaying a reference clock signal;

a first sampling circuit which samples an oscillation signal generated by the ring oscillator with the predetermined clock signal;

a first logical equalization circuit which equalizes occurrence frequency of "0" and "1" of a sampling signal sampled by the first sampling circuit;

a linear feedback shift register (LFSR) which generates random serial data based on an output signal of the first logical equalization circuit; and a serial-parallel converter which generates random parallel data used for controlling a delay amount of the delay control circuit by converting the random serial data from serial to parallel.

According to one embodiment of the present invention, a random number generation circuit, comprising:

a ring oscillator which has odd number of inverting amplifiers connected in ring shape and odd number of current amplification circuits connected to current paths of the respective inverting amplifiers;

a first sampling circuit which samples an oscillation signal generated by the ring oscillator with a predetermined clock signal;

a first logical equalization circuit which equalizes occurrence frequency of "0" and "1" of a sampling signal sampled by the first sampling circuit;

a linear feedback shift register (LFSR) which generates random serial data based on an output signal of the first logical equalization circuit; and a serial-parallel converter which generates random parallel data used for controlling a delay amount of the delay control circuit by converting the random serial data from serial to parallel.

According to one embodiment of the present invention, a random number generation circuit, comprising:

a ring oscillation type VCO which has odd number of inverting amplifiers connected in ring shape and odd number of voltage control circuits configured to perform voltage control of drive capability of the odd number of inverting amplifiers;

a first sampling circuit which samples an oscillation signal generated by the ring oscillation type VCO with a predetermined clock signal;

a first logical equalization circuit which equalizes occurrence frequency of "0" and "1" of a sampling signal sampled by the first sampling circuit;

a linear feedback shift register which generates random serial data based on an output signal of the first logical equalization circuit; and a serial-parallel converter which generates random parallel data used for controlling a delay amount of the delay control circuit by converting the random serial data from serial to parallel.

BRIEF DESCRIPTION OF THE DRAWINGS

FIG. 1 is a block diagram showing a schematic configuration of a random number generation circuit according to an embodiment of the present invention;

FIGS. 2A-2E illustrate operation timing charts of the respective parts in FIG. 1;

FIG. 6 is a block diagram showing a schematic configuration of a random number generation circuit according to a second embodiment of the present invention;

FIG. 8 is a conceptual view of fluctuation of a supply voltage in an average circuit;

FIG. 9 is a conceptual view of fluctuation of supply voltage in a circuit connected to an unstable power line; and FIG. 10 is a circuit diagram showing the internal configuration of a ring oscillator according to a third embodiment of the present invention.

DETAILED DESCRIPTION OF THE INVENTION

Figure 3:
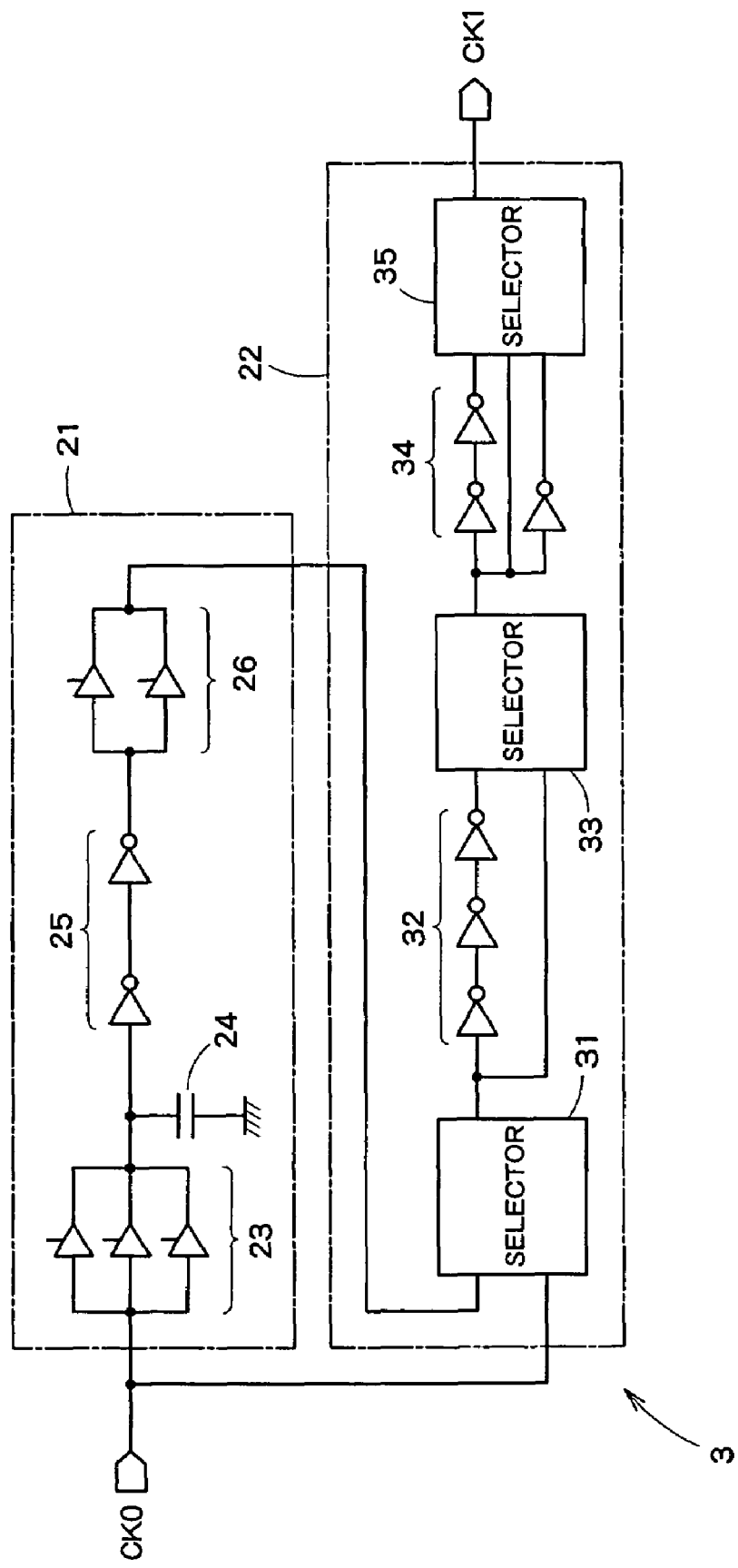
FIG. 3 is a circuit diagram showing an example of a specific configuration of a delay control circuit 3.

Hereafter, embodiments of the present invention will be described more specifically with reference to the drawings.

First Embodiment

FIG. 1 is a block diagram showing a schematic configuration of a random number generation circuit according to an embodiment of the present invention. The random number generation circuit in FIG. 1 is provided with a ring oscillator 2 which has an odd number of cascaded inverters 1, a delay control circuit 3 which delays a reference clock signal CK0 to generate delay reference clock signals CK1, CK2, a first flip-flop 4 which latches the oscillation signal generated by the ring oscillator 2 with the delay reference clock signal CK1, a first EXOR circuit 5 which equalizes occurrence frequency with which output logics "0", "1" of the first flip-flop 4 appear, a delay circuit 6 which delays the oscillation signal generated by the ring oscillator 2, a second flip-flop 7 which latches the oscillation signal delayed by the delay circuit 6 with the delay reference clock signal CK2, a second EXOR circuit 8 which equalizes occurrence frequency with which output logics "0", "1" of the second flip-flop 7 appear, a linear feedback register 9 (LFSR) which generates random numbers (random serial data) based on the output signals of the first and second EXOR circuits 5, 8 and a serial-parallel converter 10 which converts the random serial data output from the linear feedback register 9 from serial to parallel to generate random parallel data.

The ring oscillator 2 includes an OR gate 11 connected at subsequent stage of the odd number of inverters 1 and the output terminal of the OR gate 11 is connected to the input terminal of the first-stage inverter 1. The OR gate 11 includes two input terminals; one is connected to the output terminal of the first-stage inverter 1 and the other is connected to a test terminal TEST. When "1" is input to the test terminal TEST, the output of the OR gate 11 becomes "1" and the ring oscillator 2 stops oscillation operation. During normal operation, the test terminal TEST is "0", the phase of the oscillation signal generated by the ring oscillator 2 is shifted by a predetermined amount by a phase adjustment inverter 14 and the oscillation signal is then input to a data input terminal of the first flip-flop 4.

The delay reference clock signal CK1 output from the delay control circuit 3 is supplied to the clock terminal of the first flip-flop 4. The delay control circuit 3 adjusts the amount of delay of the reference clock signal CK0 from an external PLL circuit (not shown) based on the random parallel data output from the serial-parallel converter 10.

Though the output signal of the first flip-flop 4 is a low quality random number, there is a bias in occurrence frequency with which "0" and "1" appear. For this reason, an exclusive OR between the output signal of the first flip-flop 4 and the output signal of the feedback shift register 9 is calculated at the first ExOR circuit 5. As a result, the first ExOR circuit 5 outputs pseudo-random numbers in which the bias of occurrence frequency of "0" and "1" is suppressed.

The second flip-flop 7 latches the oscillation signal generated by the ring oscillator 2 and delayed by the delay circuit 6 with the delay reference clock signal CK2 and outputs a random number signal. The reason that oscillation signal generated by the ring oscillator 2 is delayed by the delay circuit 6 is to generate a random number signal of a phase different from that of the first flip-flop 4. The output signal of the second flip-flop 7 is input to the second ExOR circuit 8 to generate pseudo-random numbers in which the bias of occurrence frequency of "0" and "1" is suppressed.

Both the random number output from the first flip-flop 4 and the pseudo-random number output from the second flip-flop 7 are input to the linear feedback register 9. The linear feedback register 9 generates random serial data using these random numbers as seeds. Since the configuration of the linear feedback register 9 per se is publicly known, explanations thereof will be omitted.

The random serial data generated by the linear feedback register 9 is input to the serial-parallel converter 10 and also input to the first and second EXOR circuits 5, 8. The serial-parallel converter 10 converts the random serial data to random parallel data.

The delay control circuit 3 includes a delay circuit 12 capable of changing the amount of delay and a selector 13 which selects the amount of delay of the delay circuit 12 based on the random parallel data. Since the random parallel data per se is a random number, the amount of delay of the delay circuit 12 also changes randomly, which improves randomness of pseudo-random numbers input to the linear feedback register 9. In this way, the linear feedback register 9 can generate high quality random serial data with a high level of randomness.

Though the conventional random number generation circuit uses the linear feedback register 9, it does not give seeds with a high level of randomness to the linear feedback register 9. For example, it is assumed that the first and second flip-flops 4, 7 in FIG. 1 latch the oscillation signal of the ring oscillator 2 with the reference clock signal CK0. Then, the first and second flip-flops 4, 7 output signals with certain periodicity. The signals with such periodicity satisfy the relationship shown in Expression (1) below, where "fr" is the oscillating frequency of the ring oscillator 2, "f" is the oscillating frequency of the reference clock signal CK0, "m" and "n" are integers.

$$Fr \times m = f \times n \tag{1}$$

In this way, when the first and second flip-flops 4, 7 output signals with certain periodicity, seeds with periodicity are given to the linear feedback register 9, which prevents the linear feedback register 9 from generating high quality random numbers with a high degree of randomness. That is, the linear feedback register 9 outputs random numbers with a high possibility of collision and a low level of randomness.

Conventionally, the reference clock signal CK0 input to the flip-flop which generates seeds to be given to the linear feedback register 9 contains a jitter component and random numbers are generated by positively taking advantage of the fact that uncertainty occurs in the oscillation signal of the ring oscillator 2 due to temperature fluctuation and voltage fluctuation or the like. However, since the randomness of such random numbers varies due to environmental conditions or the like, these cannot be said to be stable, high quality random numbers. In contrast, this embodiment can generate random numbers with a sufficiently low probability of collision and high degree of randomness regardless of environmental conditions.

According to an experiment conducted by the inventor of the present invention, when a CMOS technology having a gate length of 0.18 μm was used, the ring oscillator 2 of this embodiment oscillated at approximately 2.5 GHz. It is also known that the oscillating frequency varies drastically according to the load capacity and temperature inside the ring oscillator 2.

In order to reduce power consumption, this embodiment supplies an oscillation signal of the single ring oscillator 2 to the first and second flip-flops 4, 7, but it is also possible to provide a dedicated ring oscillator 2 for each flip-flop. This will improve randomness of random numbers output from both flip-flops.

FIG. 2 shows operation timing charts of the respective parts of FIG. 1. FIG. 2A shows an output waveform of the ring oscillator 2, FIG. 2B shows a signal waveform of a reference clock, FIG. 2C shows an output waveform of the first flip-flop 4. Furthermore, FIG. 2D shows the same output waveform of the first flip-flop 4 shown in FIG. 2C, yet showing the waveform corresponding to a longer time period than that in FIG. 2C. FIG. 2E shows an output waveform of the linear feedback register 9, showing the waveform corresponding to the same time period as that in FIG. 2D.

Since the ring oscillator 2 has an oscillation signal of a much higher (double-fold or more) frequency than the reference clock signal CK0, and the oscillation signal and reference clock signal CK0 are mutually asynchronous, the first and second flip-flops 4, 7 can generate pseudo-random number signals taking advantage of the difference in frequency and phase.

As is evident from FIG. 2D, the output waveform of the first flip-flop has a bias in occurrence frequency with which "0" and "1" appear, but as shown in FIG. 2E, the bias is suppressed in the output waveform of the linear feedback register 9.

FIG. 3 is a circuit diagram showing an example of specific configuration of the delay control circuit 3. The delay control circuit 3 in FIG. 3 is provided with a micro delay amount setting part 21 which adjusts a micro amount of delay and a large delay amount setting part 22 which adjusts a large amount of delay.

The micro delay amount setting part 21 is provided with a first variable delay amount part 23 which has a plurality of tri-state buffers connected in parallel, a load capacitor 24 connected between the output terminal of the first variable delay amount part 23 and a grounding terminal, inverters 25 cascaded to the output terminal of the first variable delay amount part 23 and a second variable delay amount part 26 which is connected to the subsequent inverter 25 and has a plurality of tri-state buffers connected in parallel.

The first variable delay amount part 23 receives the reference clock signal CK0. The first variable delay amount part 23 adjusts the amount of delay of the reference clock signal CK0. The tri-state buffers inside the first variable delay amount part 23 can individually set ON/OFF. As the number of ON tri-state buffers increases, the amount of delay of the reference clock signal CK0 decreases. Likewise, the tri-state buffers inside the second variable delay amount part 26 can also individually set ON/OFF and as the number of ON tri-state buffers increases, the amount of delay of the second variable delay amount part 26 increases.

The load capacitor 24 is connected to the output terminal of the first variable delay amount part 23 and can delay a signal with a time constant determined by the impedance of the first variable delay amount part 23 and the capacitance value of the load capacitor.

There are no particular restrictions on the number of tri-state buffers connected in parallel inside the first variable delay amount part 23 and second variable delay amount part 26. As the number of tri-state buffers increases, the variable width of the amount of delay increases.

The large delay amount setting part 22 includes a first selector 31, inverters 32 cascaded to the output terminal of the first selector 31, a second selector 33, inverters 34 cascaded to the output terminal of the second selector 33 and a third selector 35.

The first selector 31 selects any one of the reference clock signal CK0 and output signal of the micro delay amount setting part 21. The second selector 33 selects any one of the output signal of the first selector 31 and the signal obtained by delaying this output signal by the inverters 32. The third selector 35 selects any one of the output signal of the second selector 33, a signal obtained by delaying this output signal by a plurality of inverters 34 and a signal obtained by delaying this output signal by only one inverter 34.

The first to third selectors 31, 33, 35 change their selection operations based on the random parallel data output from the serial-parallel converter 10 shown in FIG. 1.

The number of stages of the inverters 32, 34 inside the large delay amount setting part 22 and the number of signals to be selected by the first to third selectors 31, 33, 35 can be changed arbitrarily. Furthermore, the number of selectors 31, 33, 35 may also be increased/decreased.

In this way, the delay control circuit 3 adjusts a large amount of delay by the large delay amount setting part 22 and a micro amount of delay by the micro delay amount setting part 21. As a result, it can thereby set the reference clock signal CK0 by a desired amount of delay accurately and speedily.

FIG. 3 only illustrates components that output the delay reference clock signal CK1, but components that output the delay reference clock signal CK2 are also configured in the same way as in FIG. 3.

According to an experiment conducted by the inventor of the present invention, when a standard capacitance value is used, a propagation delay time of the inverters 1 of the CMOS process was approximately 0.1 ns. As described above, the oscillating frequency of the ring oscillator 2 is approximately 2.5 GHz, and therefore it has been proved that cascading at least four inverters 1 is enough to obtain the amount of delay corresponding to one period of the ring oscillator 2.

Figure 4:
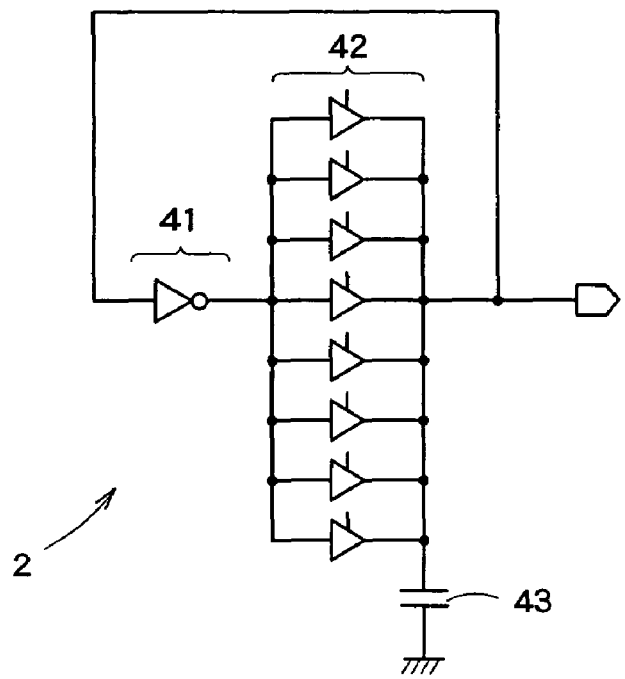
FIG. 4 is a circuit diagram showing an example of a specific configuration of the ring oscillator 2 shown in FIG. 1.

FIG. 4 is a circuit diagram showing an example of a specific configuration of the ring oscillator 2 shown in FIG. 1. The ring oscillator 2 in FIG. 4 includes an odd number of inverters 41, a plurality of tri-state buffers 42 connected in parallel to the output terminal of the final inverter 41 and a load capacitor 43 connected between the output terminals of these tri-state buffers 42 and the grounding terminal, and an oscillation signal is output from the output terminals of these tri-state buffers 42 and this oscillation signal is fed back to the input terminal of the inverter 41 at the first stage.

FIG. 4 shows an example where only one inverter 41 is provided, but there is no particular restriction on the number of inverters 1 connected as long as it is an odd number.

In FIG. 4, the plurality of tri-state buffers 42 connected in parallel can be individually turned ON/OFF and as the number of ON tri-state buffers 42 decreases, the amount of delay increases and the oscillating frequency decreases. The oscillating frequency of the ring oscillator 2 in FIG. 4 is determined by a time constant which is determined by the impedance according to the number of the ON tri-state buffers 42 and capacitance value of the load capacitor. Furthermore, by increasing/decreasing the number of tri-state buffers 42 connected in parallel, it is possible to increase/decrease the number of changeable oscillating frequencies. For example, as shown in FIG. 4, when eight tri-state buffers 42 are connected in parallel, the oscillating frequency can be changed in 8 ways.

Figure 5:
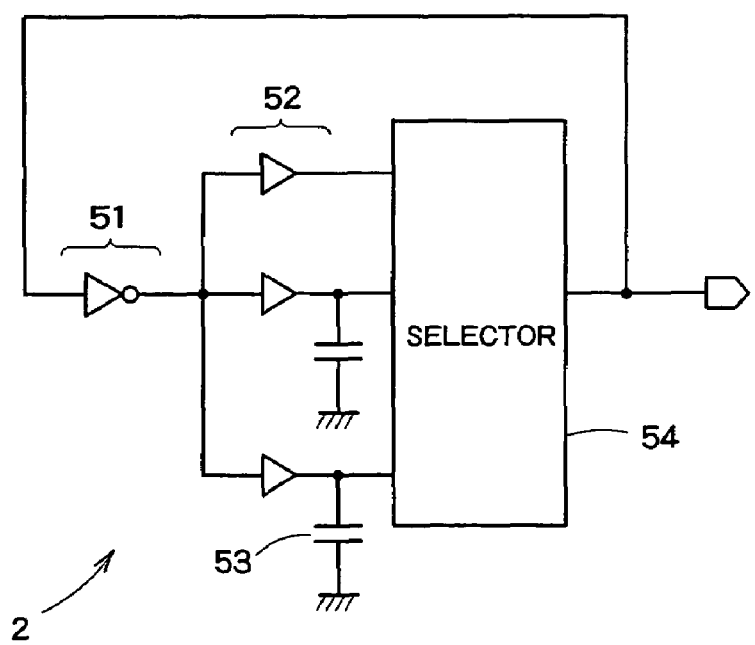
FIG. 5 is a circuit diagram showing a modification example of the ring oscillator 2.

FIG. 5 shows a circuit diagram showing a modification example of the ring oscillator 2. The ring oscillator 2 in FIG. 5 includes a plurality of buffers 52 connected in parallel at subsequent stage of an odd number of inverters 51, load capacitors 53 connected between the output terminals of at least a portion of buffers 52 and the grounding terminal, and a selector 54 which selects one of output signals of the plurality of buffers 52. An oscillation signal is output from the output of the selector 54, and this oscillation signal is fed back to the input terminal of the inverter 51 in the first stage.

The load capacitors connected to the output terminals of the buffers 52 have different capacitance values. For this reason, delay times of the output signals of the respective buffers 52 differ from one another. Thus, the selector 54 can select a signal having a desired delay time.

As described above, according to this embodiment, the first and second flip-flops 4, 7 generate pseudo-random numbers with a high level of randomness and give them to the linear feedback register 9. Therefore, it is possible to improve randomness of random numbers generated by the linear feedback register 9 and generate high quality random numbers.

Furthermore, the random number generation circuit is composed of digital circuits only, which facilitates integration. This random number generation circuit can be used for various purposes. It can be used for a wide variety of purposes, for example, a copy protection apparatus, IC card encryption key generation apparatus and random number generation apparatus of game machines.

In FIG. 1, two types of pseudo-random numbers generated by the first and second flip-flops 4, 7 are input to the linear feedback register 9 as seed. The delay circuit 6, the second flip-flop 7 and the subsequent second EXOR circuit 8 may be omitted. In this case, although randomness of the random number generated by the linear feedback register 9 deteriorates a little bit, it is possible to simplify circuit configuration.

Second Embodiment

A second embodiment is designed to randomize phase fluctuations of an oscillation signal generated by a ring oscillator.

FIG. 6 is a block diagram showing a schematic configuration of a random number generation circuit according to a second embodiment of the present invention. In FIG. 6, components common to those in FIG. 1 are assigned the same reference numerals and the following explanations will be focused on the differences.

The random number generation circuit in FIG. 6 is provided with a ring oscillator 2a having an internal configuration different from that in FIG. 1, a first flip-flop 4 which latches the output signal of the ring oscillator 2a, a first ExOR circuit 5 which equalizes occurrence frequency with which output logics "0", "1" of the first flip-flop 4 appear, a linear feedback register 9 (LFSR) which generates random numbers (random serial data) based on the output signal of the first ExOR circuit 5 and a serial-parallel converter 10 which converts the random serial data output from the linear feedback register 9 from serial to parallel and generates random parallel data.

The ring oscillator 2a includes an odd number of inverting amplifiers 61 connected in series, an odd number of current amplification circuits 62 connected to power supply routes of the respective inverting amplifiers 61 and a test selection circuit 63 connected to the output terminal of the final-stage inverting amplifiers 61.

Each inverting amplifier 61 in the ring oscillator 2a includes a PMOS transistor 64 and an NMOS transistor 65. The current amplification circuit 62 provided for each inverting amplifier 61 includes an NMOS transistor 66 and a PMOS transistor 67. Both the drain and gate of the NMOS transistor 66 are connected to an unstable power line VDD1 and the source of the NMOS transistor 66 is connected to the source of the PMOS transistor 64 in the corresponding inverting amplifier 61. The drain of the PMOS transistor 67 is connected to an unstable power line VSS1 and both the gate and source of the PMOS transistor 67 are connected to the source of the NMOS transistor 65 in the corresponding inverting amplifier 61.

The unstable power lines VDD1 and VSS1 are paired. Hereinafter, these power lines will be referred to as an "unstable power line pair." The unstable power line pair VDD1, VSS1 are connected to a voltage source 68 which has a large voltage fluctuation, that is, a large dynamic IR drop. The "dynamic IR drop" here refers to a time fluctuation of the potential at some location in the chip and may also be referred to as a "power noise." Details of this voltage source 68 will be described later.

The test selection circuit 63 in the ring oscillator 2a outputs the result of a logical OR between the output signal of the ring oscillator 2a and test signal. The output signal of the test selection circuit 63 is fed back to the input terminal of the first-stage inverting amplifiers 61.

This test selection circuit 63 is not an indispensable component, but it forcibly stops the operation of the ring oscillator 2a during a test and can thereby reduce unnecessary power consumption.

A reference clock signal CK1 is supplied to the clock terminal of the first flip-flop 4. In the first embodiment, the delay reference clock signal CK1 is supplied to the clock terminal of the first flip-flop 4, but the reference clock signal CK1 of this embodiment can be a clock signal of a predetermined phase.

Though the output signal of the first flip-flop 4 is a random number, there is a bias in occurrence frequency with which "0" and "1" appear. For this reason, the first ExOR circuit 5 calculates an exclusive OR between the output signal of the first flip-flop 4 and the output signal of the linear feedback register 9. Therefore, the first ExOR circuit 5 outputs intrinsic random numbers in which the bias of occurrence frequency of "0" and "1" is suppressed.

The intrinsic random numbers output from the first flip-flop 4 are input to the linear feedback register 9. The linear feedback register 9 generates random serial data using these random numbers as seeds.

The random serial data generated by the linear feedback register 9 is input to the serial-parallel converter 10 and the first EXOR circuit 5 as well. The serial-parallel converter 10 converts the random serial data to random parallel data.

Next, the voltage source 68 having a large dynamic IR drop connected to the unstable power line pair VDD1, VSS1 will be explained. The dynamic IR drop increases particularly in locations where the transistor switch is frequently turned ON/OFF. An experiment conducted by the inventor of the present invention shows that the dynamic IR drop is particularly large in a data bus or a block carrying out encryption processing in the chip. Therefore, when the power line of the data bus and power line of the block carrying out encryption processing are used as the above described voltage source 68, it is possible to increase the power supply fluctuation compared to a case where the unstable power line pair VDD1, VSS1 is connected to other general power lines.

Here, the other general power lines refer to cases where the connection destination is not particularly specified when the unstable power line pair VDD1, VSS1 are automatically arranged and wired. In this case, since the power line of the ring oscillator 2a and power line of its peripheral circuit are shared, the potential fluctuation width of the unstable power line pair VDD1, VSS1 does not increase so much.

The current amplification circuit 62 in the ring oscillator 2a amplifies the amount of potential fluctuation of the unstable power line pair VDD1, VSS1. For example, when the potential of the unstable power line VDD1 drops, the drive voltage of the NMOS transistor in the ring oscillator 2a drops, and therefore the switching speed of the transistor drops and the oscillating frequency of the ring oscillator 2a decreases.

On the contrary, when the potential of the unstable power line VDD1 increases, the drive voltage of the NMOS transistor in the ring oscillator 2a increases, and therefore the switching speed of the transistor increases and the oscillating frequency of the ring oscillator 2a increases.

Thus, a jitter component in the oscillation signal of the ring oscillator 2a varies drastically depending on the potential and temperature, and the frequency and phase of the oscillation signal vary. The amount of the phase fluctuation is several tens to several hundreds of times the period of the reference clock signal CK1. When the phase of the oscillation signal of the ring oscillator 2a varies, the output amplitude of the first flip-flop 4 which latches the oscillation signal also varies and the randomness of the output data of the first flip-flop 4 increases.

The above described jitter component of the conventional random number generation circuit is small, and therefore even if the linear feedback register 9 is used, seeds with a high level of randomness are never given to the linear feedback register 9.

For example, it is assumed that the first flip-flop 4 shown in FIG. 1 latches the oscillation signal of the ring oscillator 2a with the reference clock signal CK0. The first flip-flop 4 outputs data having certain periodicity. Such data with periodicity is generated when the oscillating frequency of the ring oscillator 2a is a multiple-fold of the reference clock signal. This is a phenomenon called "lock" which means that the seeds generated have values with certain periodicity.

In this case, seeds having periodicity are given to the linear feedback register 9 and the linear feedback register 9 can no longer generate high quality random numbers with a high level of randomness. That is, in this case, the linear feedback register 9 outputs random numbers having certain periodicity, and therefore there is a high probability of collision and it is not possible to generate random numbers with a high level of randomness. Moreover, the level of randomness of random numbers generated by the linear feedback register 9 changes due to environmental conditions or the like, and therefore they cannot be said to be high quality random numbers with stability.

In contrast, according to this embodiment, seeds supplied to the linear feedback register 9 per se have a high level of randomness, and therefore it is possible to generate random numbers constantly having a low probability of collision and with a high level of randomness.

According to an experiment by the inventor of the present invention, when a CMOS technology having a gate length of 0.18 μm was used, the ring oscillator 2a in FIG. 1 oscillated at approximately 2.5 GHz, but the oscillating frequency changed drastically according to the load capacitor and temperature in the ring oscillator 2a. Therefore, the experiment result confirmed that positive increase of the supply voltage fluctuation component can lead to improvement of quality of random numbers.

Figure 7:
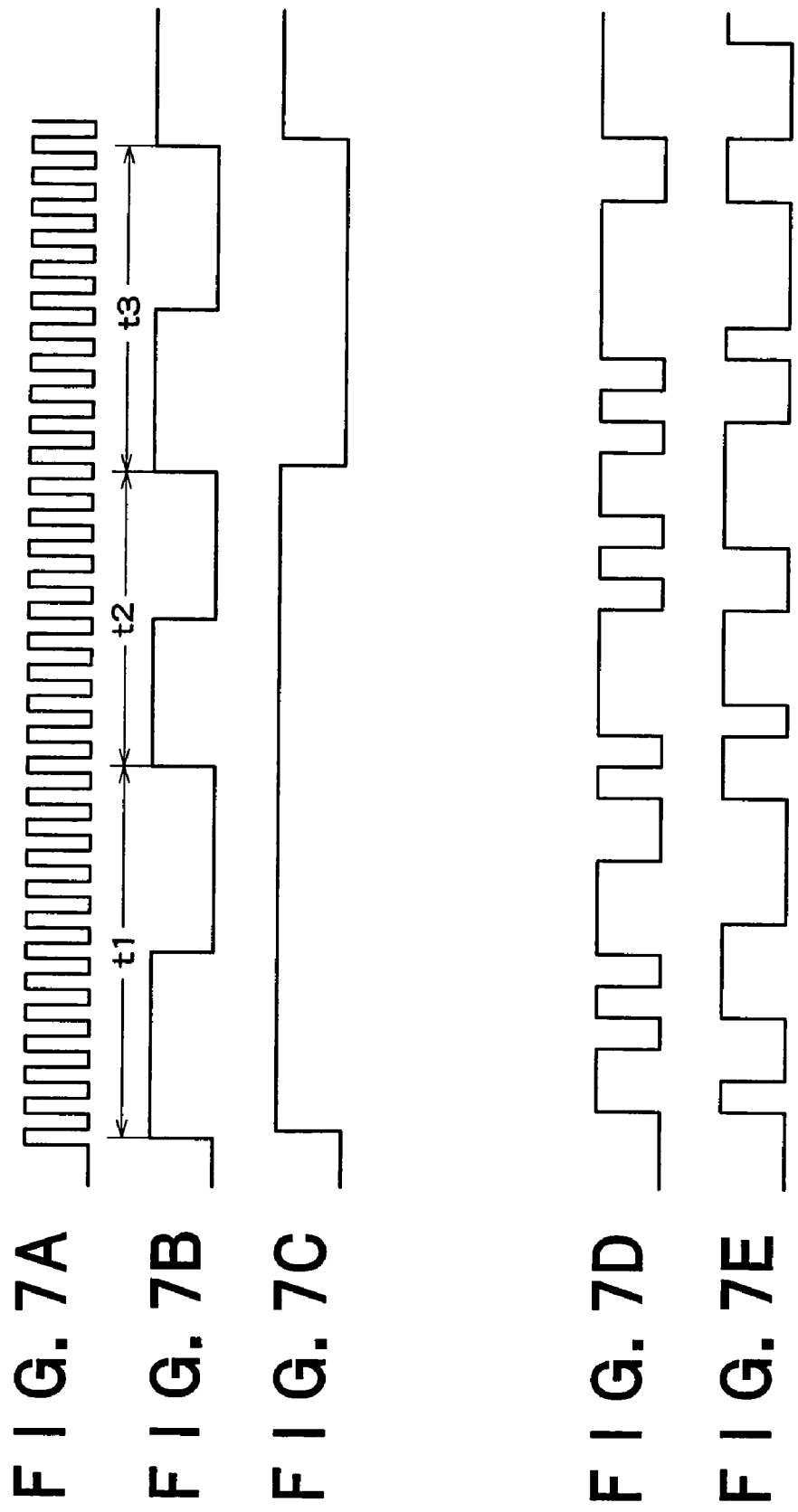
FIGS. 7A to 7E is a diagram showing operation timings of the respective parts in FIG. 6.

FIGS. 7A-7E show operation timing drawings of the respective parts in FIG. 6. FIG. 7A shows an output waveform of the ring oscillator 2a, FIG. 7B shows a signal waveform of a reference clock signal, FIG. 7C shows an output waveform of the first flip-flop 4. Furthermore, FIG. 7D shows the same output waveform of the first flip-flop 4 as that of FIG. 7C, but shows the waveform corresponding to a longer time period than that in FIG. 7C. FIG. 7E shows an output waveform of the linear feedback register 9 and shows the waveform at the same time period as that in FIG. 7D.

Since the oscillation signal of the ring oscillator 2a has an oscillation signal with a much higher frequency than the reference clock signal and both signals are mutually asynchronous, if the level of randomness of the oscillation signal is high, the first flip-flop 4 that latches the oscillation signal can generate high quality pseudo-random number signals.

As is evident from FIG. 7D, the output waveform of the first flip-flop 4 has a bias in occurrence frequency with which "0" and "1" appear, but as shown in FIG. 7E, the bias is suppressed in the output waveform of the linear feedback register 9.

FIG. 8 is a conceptual view of fluctuations of supply voltage in an average circuit. As shown in FIG. 8, a dynamic maximum voltage drop is several times larger than a static voltage drop.

On the other hand, FIG. 9 is a conceptual view of fluctuations of supply voltage in a circuit connected to an unstable power line. The amount of fluctuation of supply voltage within a unit time in FIG. 9 is several times to several tens of times larger than that in FIG. 8.

The above described embodiment has explained the case where the voltage source 68 connected to the unstable power line pair VDD1, VSS1 is used as the power line in the data bus, but the type of the voltage source 68 is not particularly limited. For example, a power line of a circuit block having a large power supply fluctuation in the chip may also be used as the voltage source 68. The circuit block having a large power supply fluctuation in the chip can be detected using a simulation or using a power consumption analysis tool or the like.

Or an externally connected power supply apparatus may also be used as the voltage source 68. When an unstable power supply is received from the power supply apparatus, it is possible to provide an external connection terminal connected to the unstable power line VDD1 and an external connection terminal connected to the unstable power line VSS1, to connect a power supply apparatus and to supply unstable power.

A recent power supply apparatus often outputs a stable DC voltage with little power supply fluctuation, and therefore it is desirable to use an old power supply apparatus which outputs an unstable voltage with a large power supply fluctuation as the power supply apparatus in this embodiment. Especially, if the power supply apparatus having low rated capacity, it is further desirable because the power supply voltage cannot catch up with the fluctuation of power consumption in the chip.

In this way, according to the second embodiment, the unstable power line pair VDD1, VSS1 is connected to the power supply routes of the ring oscillator 2a, and therefore the frequency and phase of the oscillation signal of the ring oscillator 2a fluctuate randomly, and therefore the output of the first flip-flop 4 which latches this oscillation signal also changes randomly. Therefore, the linear feedback register 9 can generate high quality random numbers with a high level of randomness.

Third Embodiment

A third embodiment is a modification example of the second embodiment and provides a ring oscillation type VCO instead of the ring oscillator 2a.

FIG. 10 is a circuit diagram showing internal configuration of a ring oscillation type VCO 2b used in the third embodiment. This ring oscillation type VCO 2b is used in place of the ring oscillator 2a in FIG. 6 and the rest of components within the random number generation circuit are the same as those in FIG. 6, and therefore those components are omitted in FIG. 10.

The ring oscillation type VCO 2b in FIG. 10 is provided with an odd number of inverting amplifiers 61 connected in a ring shape and an odd number of voltage control circuits 69 which perform voltage control of the respective drive capabilities of the odd number of inverting amplifiers 61.

Each inverting amplifier 61 in the ring oscillation VCO 2b includes a PMOS transistor 64 and NMOS transistor 65. The voltage control circuit 69 provided for each inverting amplifier 61 includes a PMOS transistor 70 and NMOS transistor 71. The source of the PMOS transistor 70 is connected to an unstable power line VDD1, the gate is connected to an unstable power line VSS2, the drain is connected to the source of the PMOS transistor 64 in the inverting amplifier 61. The drain of the NMOS' transistor 71 is connected to the source of the NMOS transistor 65, the gate of the NMOS transistor 71 is connected to an unstable power line VDD2 and the source is connected to an unstable power line VSS1.

Thus, the ring oscillation type VCO 2b in FIG. 10 is connected to two pairs of unstable power lines (VDD1, VSS1), (VDD2, VSS2). These two pairs of unstable power lines produce a power supply fluctuation independently of each other, and therefore the frequency and phase of the oscillation signal of the ring oscillation type VCO 2b vary more randomly. Therefore, the quality of random numbers generated using this oscillation signal also improves.

A voltage source 68 which generate two pairs of unstable power lines may be a power line of an internal bus or an externally connected power supply apparatus or the like.

In FIG. 10, the output signal of the final-stage inverting amplifier 61 is fed back to the input terminal of the first-stage inverting amplifier 61, but as in the case of FIG. 6, it is also possible to cause the output signal of the final-stage inverting amplifier 61 to be fed back to the input terminal of the first-stage inverting amplifier 61 through a test selection circuit 63.

Thus, since the third embodiment supplies power to the ring oscillation type VCO 2b through the two pairs of unstable power lines, the frequency and phase of the oscillation signal of the ring oscillation type VCO 2b fluctuate more randomly. As a result, the level of randomness generated by a linear feedback register 9 also increases, producing high quality random numbers.

What is claimed is:

1. A random number generation circuit, comprising:
   a ring oscillator which has odd number of inverting amplifiers connected in ring shape;
   a delay control circuit which generates a predetermined clock signal by delaying a reference clock signal;
   a first sampling circuit which samples an oscillation signal generated by the ring oscillator with the predetermined clock signal;
   a first logical equalization circuit which equalizes occurrence frequency of "0" and "1" of a sampling signal sampled by the first sampling circuit;
   a linear feedback shift register (LFSR) which generates random serial data based on an output signal of the first logical equalization circuit; and
   a serial-parallel converter which generates random parallel data used for controlling a delay amount of the delay control circuit by converting the random serial data from serial to parallel.

2. The random number generation circuit according to claim 1, further comprising:
   a delay circuit which delays the oscillation signal generated by the ring oscillator by a predetermined amount;
   a second sampling circuit which samples the oscillation signal delayed by the delay circuit with the predetermined clock signal; and
   a second logical equalization circuit which equalizes occurrence frequency of "0" and "1" of the sampling signal sampled by the second sampling circuit,
   wherein the linear feedback shift register generates the random serial data based on the output signal of the first logical equalization circuit and the output signal of the second logical equalization circuit.

3. The random number generation circuit according to claim 2,
   wherein the clock signal of the first sampling circuit and the clock signal of the second sampling circuit are asynchronous to each other.

4. The random number generation circuit according to claim 1,
   wherein oscillating frequency of the oscillation signal generated by the ring oscillator is double-fold or more higher than the frequency of the predetermined clock signal.

5. The random number generation circuit according to claim 1, wherein the delay control circuit includes:
   a micro delay amount setting part where adjusts a micro delay amount by variably controlling the number of buffers connected in parallel; and
   a large delay amount setting part which is connected to the delay control circuit and adjusts a delay amount larger than that of the micro delay amount setting part by variably controlling the number of buffers connected in serial.

6. The random number generation circuit according to claim 5,
   wherein the large delay amount setting part sets the delay amount based on parallel data generated by the serial-parallel converter.

7. The random number generation circuit according to claim 1,
   wherein the ring oscillator has a buffer part connected to the odd number of inverting amplifiers in serial;
   the buffer part has a plurality of buffers connected in parallel and a capacitor connected at subsequent stage of at least one of the plurality of buffers; and
   the ring oscillator variably controls the oscillating frequency of the oscillation signal by adjusting the number of buffers connected in parallel or a capacitance of the capacitor.

8. The random number generation circuit according to claim 1,
   wherein the ring oscillator includes:
   odd number of inverting amplifiers connected in serial;
   a plurality of buffers connected in parallel to the output terminal of the inverting amplifier at a final stage;
   a load capacitor connected between the output terminal of at least one of the plurality of buffers and a reference voltage terminal; and
   a selector which selects one of the output signals of the plurality of buffers.

9. A random number generation circuit, comprising:
   a ring oscillator which has odd number of inverting amplifiers connected in ring shape and odd number of current amplification circuits connected to current paths of the respective inverting amplifiers;

a first sampling circuit which samples an oscillation signal generated by the ring oscillator with a predetermined clock signal;

a first logical equalization circuit which equalizes occurrence frequency of "0" and "1" of a sampling signal sampled by the first sampling circuit;

a linear feedback shift register (LFSR) which generates random serial data based on an output signal of the first logical equalization circuit; and a serial-parallel converter which generates random parallel data by converting the random serial data from serial to parallel.

10. The random number generation circuit according to claim 9, further comprising:

a first power supply line which supplies at least one of the first sampling circuit the first logical equalization circuit, the linear feedback shift register and the serial-parallel converter except for the ring oscillator with a power supply voltage; and a second power supply line which has voltage fluctuation larger than that of the first power supply line, wherein the second power supply line is connected to the odd number of current amplification circuit.

11. The random number generation circuit according to claim 10, wherein the second power supply line is connected to a power supply line of an internal bus including a plurality of signal lines.

12. The random number generation circuit according to claim 10, wherein the first power supply line is connected to a first external power supply via a first external power supply terminal; and the second power supply line is connected to a second external power supply having voltage fluctuation larger than that of the first external power supply via a second external power supply terminal.

13. The random number generation circuit according to claim 9, wherein each of the odd number of current amplification circuits includes:

a first NMOS transistor connected between a power supply terminal of the corresponding inverting amplifier and a first reference power supply terminal; and a first PMOS transistor connected between a grounding terminal of the corresponding inverting amplifier and a second reference power supply terminal.

14. The random number generation circuit according to claim 13, further comprising:

a first power supply pair line which supplies first and second power supply voltages; and a second power supply pair line which supplies third and fourth power supply voltages having voltage fluctuation larger than that of the first and second power supply voltages, wherein a drain terminal and a gate terminal of the first NMOS transistor are supplied with the third power supply voltage;

a source terminal of the first NMOS transistor is connected to a source terminal of a second PMOS transistor constituting the inverting amplifier;

a source terminal of a second NMOS transistor constituting the inverting amplifier is connected to a gate terminal and a source terminal of the first PMOS transistor; and a drain terminal of the first PMOS transistor is supplied with the fourth power supply voltage.

15. A random number generation circuit, comprising:

a ring oscillation type VCO which has odd number of inverting amplifiers connected in ring shape and odd number of voltage control circuits configured to perform voltage control of drive capability of the odd number of inverting amplifiers;

a first sampling circuit which samples an oscillation signal generated by the ring oscillation type VCO with a predetermined clock signal;

a first logical equalization circuit which equalizes occurrence frequency of "0" and "1" of a sampling signal sampled by the first sampling circuit;

a linear feedback shift register which generates random serial data based on an output signal of the first logical equalization circuit; and a serial-parallel converter which generates random parallel data by converting the random serial data from serial to parallel.

16. The random number generation circuit according to claim 15, further comprising:

a first power supply line which supplies at least one circuit except for the ring oscillation type VCO with a power supply voltage; and a second power supply line having voltage fluctuation larger than that of the first power supply line, wherein the second power supply line is connected to the odd number of voltage control circuits.

17. The random number generation circuit according to claim 16, wherein the second power supply line is connected to a power supply line of an internal bus including a plurality of signal lines.

18. The random number generation circuit according to claim 16, wherein the first power supply line is connected to a first external power supply via a first external power supply terminal; and the second power supply line is connected to a second external power supply having voltage fluctuation larger than that of the first external power supply via a second external power supply terminal.

19. The random number generation circuit according to claim 15, wherein each of the odd number of voltage control circuits includes:

a PMOS transistor connected between a power supply terminal of the corresponding inverting amplifier and a first reference power supply terminal; and an NMOS transistor connected between a grounding terminal of the corresponding inverting amplifier and a second reference power supply terminal.

20. The random number generation circuit according to claim 15, further comprising:

a first power supply pair line which supplies first and second power supply voltages;

a second power supply pair line which supplies third and fourth power supply voltages having voltage fluctuation larger than that of the first and second power supply voltages; and a third power supply pair line which is provided separately from the second voltage supply pair line and supplies fifth and sixth power supply voltages having voltage fluctuation larger than that of the first and second power supply voltages,
wherein the second power supply pair line is connected to a source terminal of the PMOS transistor and a source terminal of the NMOS transistor; and the third power supply pair line is connected to a gate terminal of the PMOS transistor and a gate terminal of the NMOS transistor.

* * * * *